US012593694B2

(12) United States Patent
Chien et al.

(10) Patent No.: US 12,593,694 B2
(45) Date of Patent: Mar. 31, 2026

(54) ELECTRONIC PACKAGE AND SUBSTRATE STRUCTURE THEREOF

(71) Applicant: SILICONWARE PRECISION INDUSTRIES CO., LTD., Taichung City (TW)

(72) Inventors: Hsiu-Fang Chien, Taichung City (TW); Wen-Chen Hsieh, Taichung City (TW); Chia-Wen Tsao, Taichung City (TW); Hsin-Yin Chang, Taichung City (TW); Ya-Ting Chi, Taichung City (TW); Yi-Lin Tsai, Taichung City (TW)

(73) Assignee: SILICONWARE PRECISION INDUSTRIES CO., LTD., Taichung City (TW)

( * ) Notice: Subject to any disclaimer, the term of this patent is extended or adjusted under 35 U.S.C. 154(b) by 628 days.

(21) Appl. No.: 17/893,599

(22) Filed: Aug. 23, 2022

(65) Prior Publication Data

US 2023/0253342 A1 Aug. 10, 2023

(30) Foreign Application Priority Data

Feb. 9, 2022 (TW) .................................. 111104763

(51) Int. Cl.
*H01L 23/00* (2006.01)
*H01L 23/498* (2006.01)
(52) U.S. Cl.
CPC ...... *H01L 23/562* (2013.01); *H01L 23/49838* (2013.01); *H01L 24/16* (2013.01); *H01L 24/32* (2013.01); *H01L 24/73* (2013.01); *H01L*
*2224/16227* (2013.01); *H01L 2224/32225* (2013.01); *H01L 2224/73204* (2013.01)
(58) Field of Classification Search
CPC ....... H01L 23/562; H01L 24/16; H01L 24/32; H01L 24/73; H01L 2224/16227; H01L 2224/32225; H01L 2224/73204; H05K 1/0271
See application file for complete search history.

(56) References Cited

U.S. PATENT DOCUMENTS

2007/0267759 A1* 11/2007 Liao ........................ H05K 3/243
257/E23.07
2021/0066828 A1* 3/2021 Woo .......................... G02F 1/00

* cited by examiner

*Primary Examiner* — Jeremy C Norris
(74) *Attorney, Agent, or Firm* — Dority & Manning, PA

(57) ABSTRACT

An electronic package is provided and includes a substrate structure and an electronic element disposed on the substrate structure. The substrate structure is provided with a plurality of circuits and a reinforcing portion that is free from being electrically connected to the plurality of circuits on a surface of a substrate body of the substrate structure, such that the electronic element is electrically connected to the plurality of circuits and is free from being electrically connected to the reinforcing portion, and the reinforcing portion includes a dummy pad and a trace line connected to the dummy pad to increase a layout area of the reinforcing portion on the substrate body. Therefore, the adhesion of the reinforcing portion can be improved, and the electronic element can be prevented from cracking.

20 Claims, 4 Drawing Sheets

ELECTRONIC PACKAGE AND SUBSTRATE STRUCTURE THEREOF

BACKGROUND

1. Technical Field

The present disclosure relates to a semiconductor device, and more particularly, to an electronic package and substrate structure thereof that can improve production yield.

2. Description of Related Art

In the development of semiconductor packaging, a lead frame was often used as a carrier for carrying active element in early days, the main reason thereof is that it has advantages of lower manufacturing cost and higher reliability. However, with the flourishing development of the electronic industries, electronic products are trending toward light, thin and short in type, and are toward high-performance, high-function, and high-speed research and development in terms of function. Therefore, in order to meet the requirements of high integration and miniaturization of semiconductor devices, the lead frame is gradually replaced by a packaging substrate with high-density and fine-pitch circuits in the existing packaging process.

As shown in FIG. 1, a conventional packaging substrate 1 includes a substrate body 10 and a plurality of reinforcing portions 11 disposed on the substrate body 10, where the overall structural strength of the packaging substrate 1 is enhanced by the reinforcing portions 11. The substrate body 10 has a plurality of routing layers (not shown), and the routing layers are electrically connected to each other by a plurality of conductive blind vias (not shown). The reinforcing portions 11 are dummy pad structures without electrical function, i.e., the reinforcing portions 11 are not electrically connected to the routing layer.

However, in the conventional packaging substrate 1, since the reinforcing portions 11 are merely dummy structures, so that the contact areas between the reinforcing portions 11 and the outermost surface of the substrate body 10 are extremely small, resulting in poor adhesion between the reinforcing portions 11 and the substrate body 10, so the reinforcing portions 11 are prone to fall off.

In addition, since the contact areas between the reinforcing portions 11 and the outermost surface of the substrate body 10 are limited, it is difficult for the packaging substrate 1 to disperse the stress of the semiconductor chip when the packaging substrate 1 carries the semiconductor chip on a die placement area A subsequently, so the semiconductor chip is prone to crack.

Therefore, how to overcome the aforementioned drawbacks of the prior art has become an urgent issue to be addressed at present.

SUMMARY

In view of the various shortcomings of the prior art, the present disclosure provides a substrate structure, which comprises: a substrate body provided with a plurality of circuits on a surface thereof; and a reinforcing portion disposed on the surface of the substrate body and free from being electrically connected to the plurality of circuits, wherein the reinforcing portion comprises at least one dummy pad and at least one trace line connected to the at least one dummy pad.

The present disclosure further provides an electronic package, which comprises: the aforementioned substrate structure; and an electronic element disposed on the surface of the substrate body and electrically connected to the plurality of circuits, wherein the electronic element is free from being electrically connected to the reinforcing portion.

In the aforementioned electronic package, the electronic element is a semiconductor chip.

In the aforementioned electronic package and substrate structure thereof, the surface of the substrate body is defined with a die placement area and a layout area surrounding the die placement area, such that the electronic element is disposed on the die placement area. For instance, the at least one dummy pad is disposed at a corner of the die placement area. Alternatively, an area of the reinforcing portion arranged on the die placement area of the surface of the substrate body is greater than or equal to 3500 $\mu m^2$.

In the aforementioned electronic package and substrate structure thereof, the reinforcing portion is made of metal.

In the aforementioned electronic package and substrate structure thereof, the at least one trace line is of a straight line shape.

In the aforementioned electronic package and substrate structure thereof, the at least one trace line has at least one curved line segment. For instance, the at least one curved line segment is of an arc shape or a wavy shape; alternatively, a straight line distance between opposite ends of the at least one curved line segment is 15 $\mu m$; or the at least one curved line segment is of a straight-angle bend shape.

In the aforementioned electronic package and substrate structure thereof, an area of the reinforcing portion arranged on the surface of the substrate body is greater than or equal to 3500 $\mu m^2$.

As can be understood from the above, in the electronic package and substrate structure thereof of the present disclosure, the layout area of the reinforcing portion is increased via the design of the trace line, which not only can improve the adhesion of the reinforcing portion, but also can prevent the electronic element from cracking. Therefore, compared with the prior art, the electronic package and substrate structure thereof of the present disclosure can effectively improve production yield.

DETAILED DESCRIPTIONS

Figure 1:
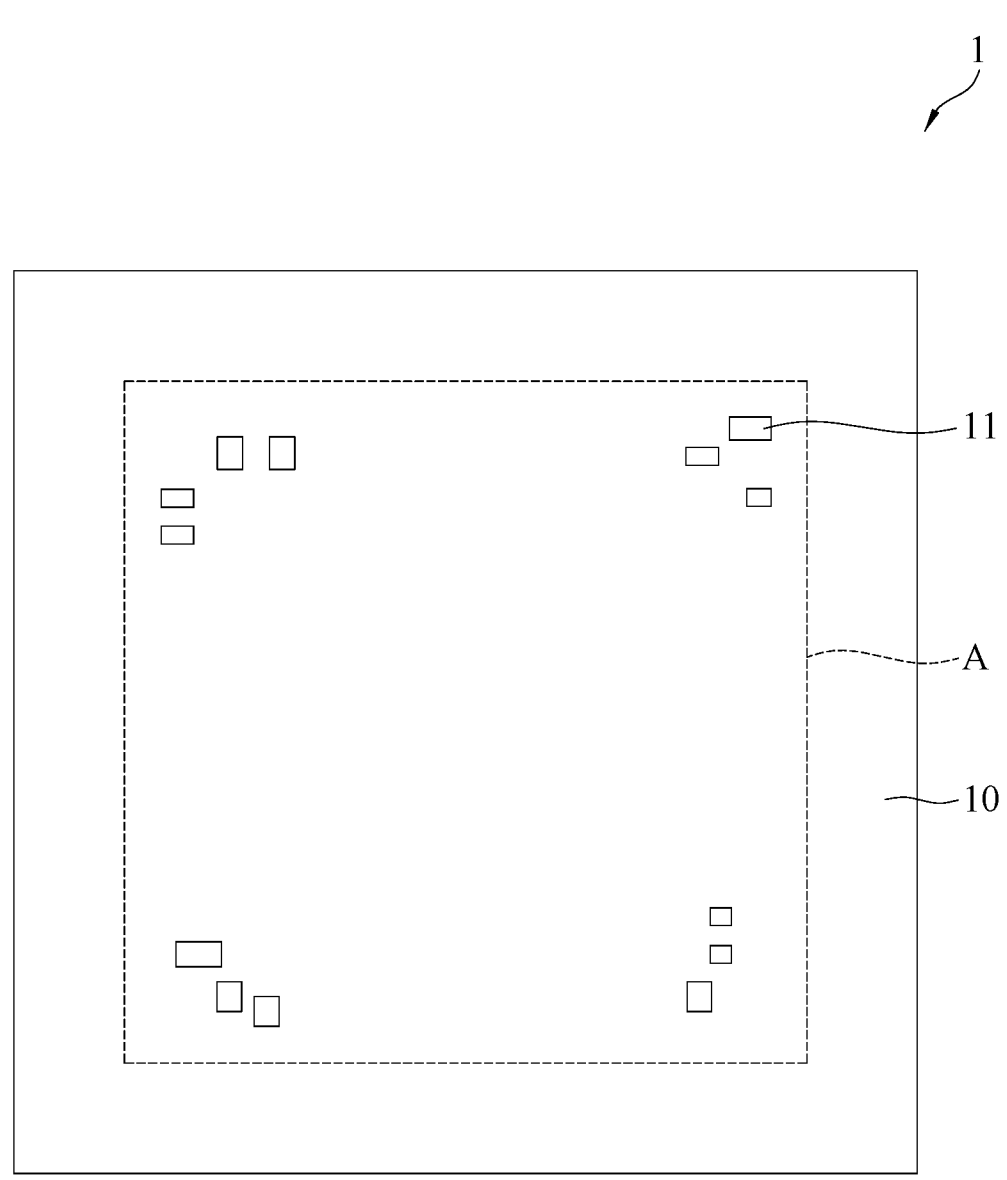
FIG. 1 is a schematic top view of a conventional packaging substrate.

Implementations of the present disclosure are illustrated using the following embodiments. One of ordinary skill in the art can readily appreciate other advantages and technical effects of the present disclosure upon reading the content of this specification.

It should be noted that the structures, ratios, sizes, etc. shown in the drawings appended to this specification are to be construed in conjunction with the disclosure of this specification in order to facilitate understanding of those skilled in the art. They are not meant to limit the implementations of the present disclosure, and therefore have no substantial technical meaning. Any modifications of the structures, changes of the ratio relationships, or adjustments of the sizes, are to be construed as falling within the range covered by the technical content disclosed herein to the extent of not causing changes in the technical effects created and the objectives achieved by the present disclosure. Meanwhile, terms such as "on," "a," "one," and the like recited herein are for illustrative purposes, and are not meant to limit the scope in which the present disclosure can be implemented. Any variations or modifications to their relative relationships, without changes in the substantial technical content, should also to be regarded as within the scope in which the present disclosure can be implemented.

Figure 2A:
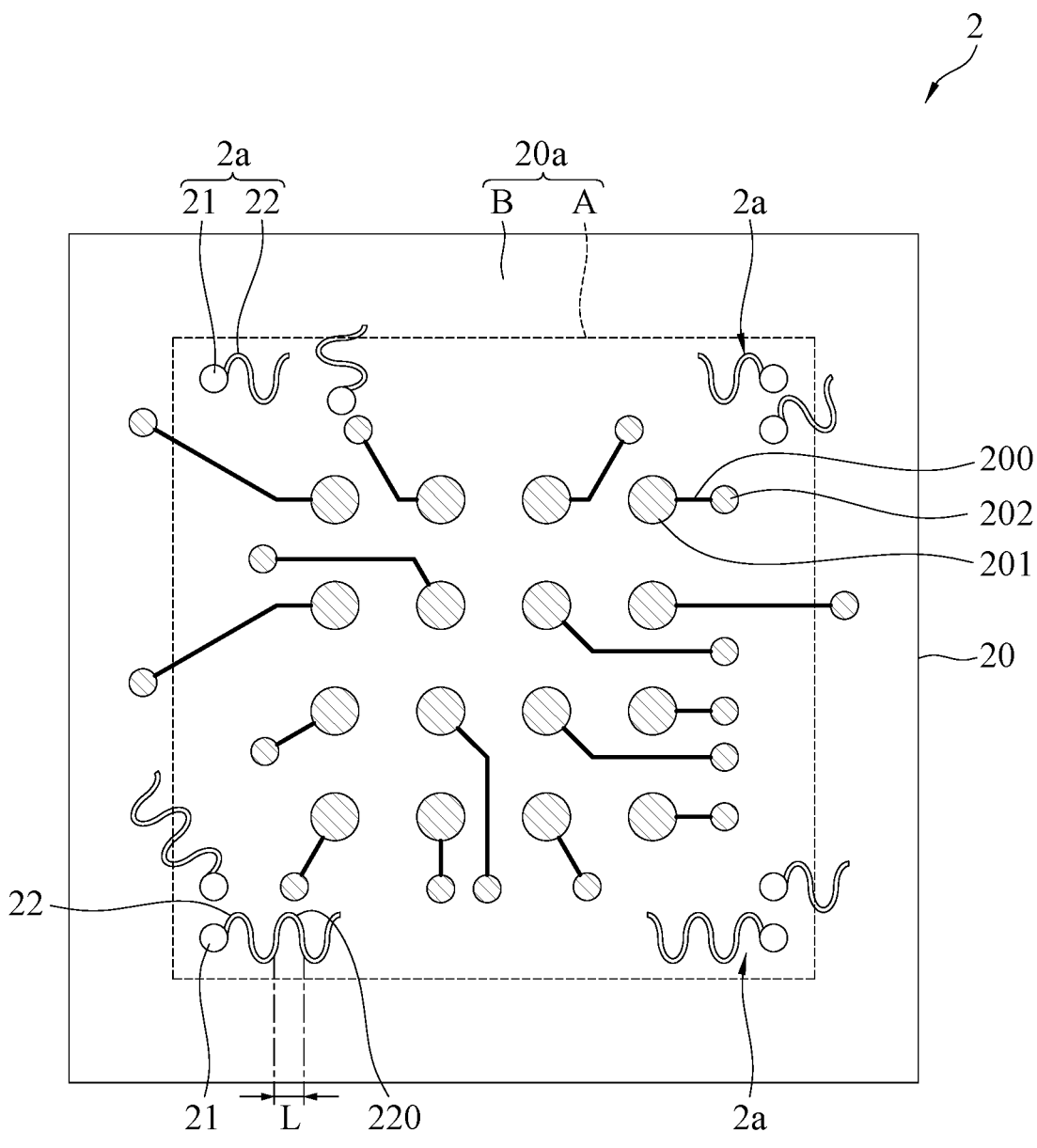
FIG. 2A is a schematic top view of a substrate structure of the present disclosure.

FIG. 2A is a schematic top view of a substrate structure 2 of the present disclosure. As shown in FIG. 2A, the substrate structure 2 is for example a packaging substrate for carrying a semiconductor chip, the substrate structure 2 comprises a substrate body 20, and at least one reinforcing portion 2a disposed on the substrate body 20, wherein the reinforcing portion 2a comprises at least one dummy pad 21 and at least one trace line 22 connected to the dummy pad 21.

The substrate body 20 is for example a circuit structure with a core layer or a coreless circuit structure, where at least one routing layer (such as a fan out type redistribution layer [RDL]) is formed on at least one insulating layer, and the outermost routing layer comprises a plurality of circuits 200 and electrical contact pads 201 bonded with the ends of the circuits 200, and the routing layers are electrically connected to each other by a plurality of conductive blind vias 202.

Figure 4:
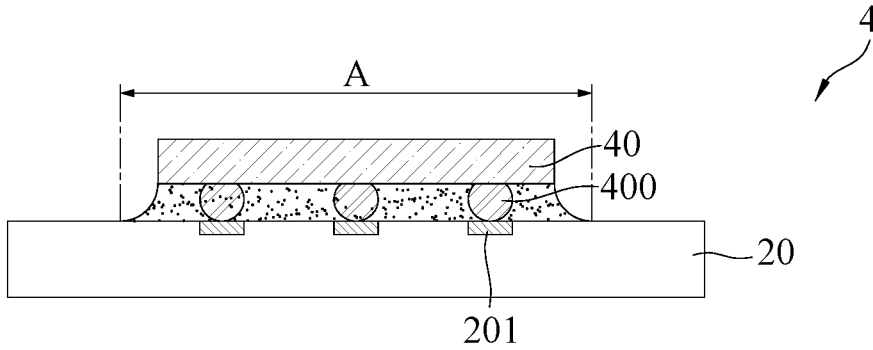
FIG. 4 is a schematic cross-sectional view of an electronic package of the present disclosure.

In an embodiment, the outermost surface 20a of the substrate body 20 is defined with a die placement area A and a layout area B surrounding the die placement area A, such that the routing layer is disposed on the die placement area A and the layout area B, and the die placement area A is used for disposing an electronic element 40 such as a semiconductor chip or a passive element to form an electronic package 4 as shown in FIG. 4. In an embodiment, the substrate body 20 is a rectangular body, and the die placement area A is a rectangular area.

Besides, if the electronic element 40 is a semiconductor chip, it can be disposed on the electrical contact pads 201 and electrically connected to the circuits 200 by a flip-chip method via a plurality of conductive bumps 400 such as solder material; alternatively, the electronic element 40 can be electrically connected to the circuits 200 by a wire bonding method via a plurality of bonding wires (not shown). However, the manner in which the electronic element 40 is electrically connected to the routing layer is not limited to the above.

In addition, the material for forming each of the routing layers is copper, and each of the insulating layers is a dielectric material such as polybenzoxazole (PBO), polyimide (PI), prepreg (PP) and the like, or a solder-resist material such as solder mask and graphite.

The reinforcing portion 2a is disposed on the die placement area A and is free from being electrically connected to the routing layer of the substrate body 20, so the electronic element 40 is free from being electrically connected to the reinforcing portion 2a in the subsequent application of the substrate structure 2.

In an embodiment, the dummy pad 21 is a metal pad such as a copper pad, which is disposed on the die placement area A, preferably at the corners of the die placement area A (corresponding to the four corners with the greatest stress of the chip), and the dummy pad 21 can be connected to the trace line 22 to prevent the dummy pad 21 from falling off due to excessive stress.

Figure 3:
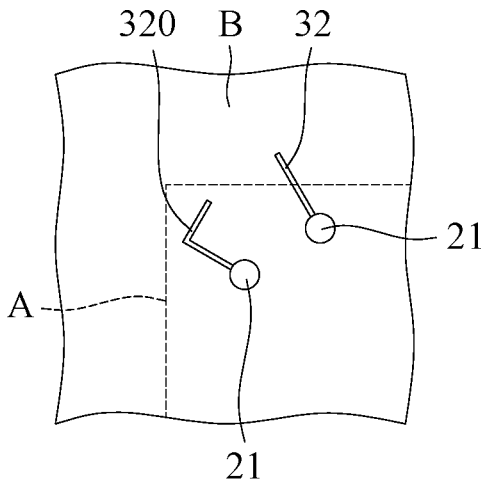
FIG. 3 is a schematic partial top view showing another aspect of FIG. 2A.

Moreover, the trace line 22 is a metal wire such as a copper wire, which is disposed on the die placement area A and can extend to the layout area B according to requirements. For example, the trace line 22 can have at least one curved line segment 220, and the curved line segment 220 can be of an arc shape or a wavy shape, such that a straight line distance L between opposite ends of the curved line segment 220 is 15 µm. Preferably, a single trace line 22 has two curved line segments 220. It should be understood that as shown in FIG. 3, a trace line 32 which is connected to the dummy pad 21 can also be of a straight line shape, and a curved line segment 320 can also be of a straight-angle bend shape, the best included angle is less than 45 degrees, which can avoid the problem of wire breakage.

Furthermore, the area of the reinforcing portion 2a (the dummy pad 21 and the trace line 22) arranged on the outermost surface 20a of the substrate body 20 is greater than or equal to 3500 $\mu m^2$, and if the single trace line 22 has two curved line segments 220, then the area of the reinforcing portion 2a arranged on the outermost surface 20a of the substrate body 20 is easily to be greater than or equal to 3500 $\mu m^2$. It should be understood that the area excludes the metal area of the outermost routing layer.

Figure 2B:
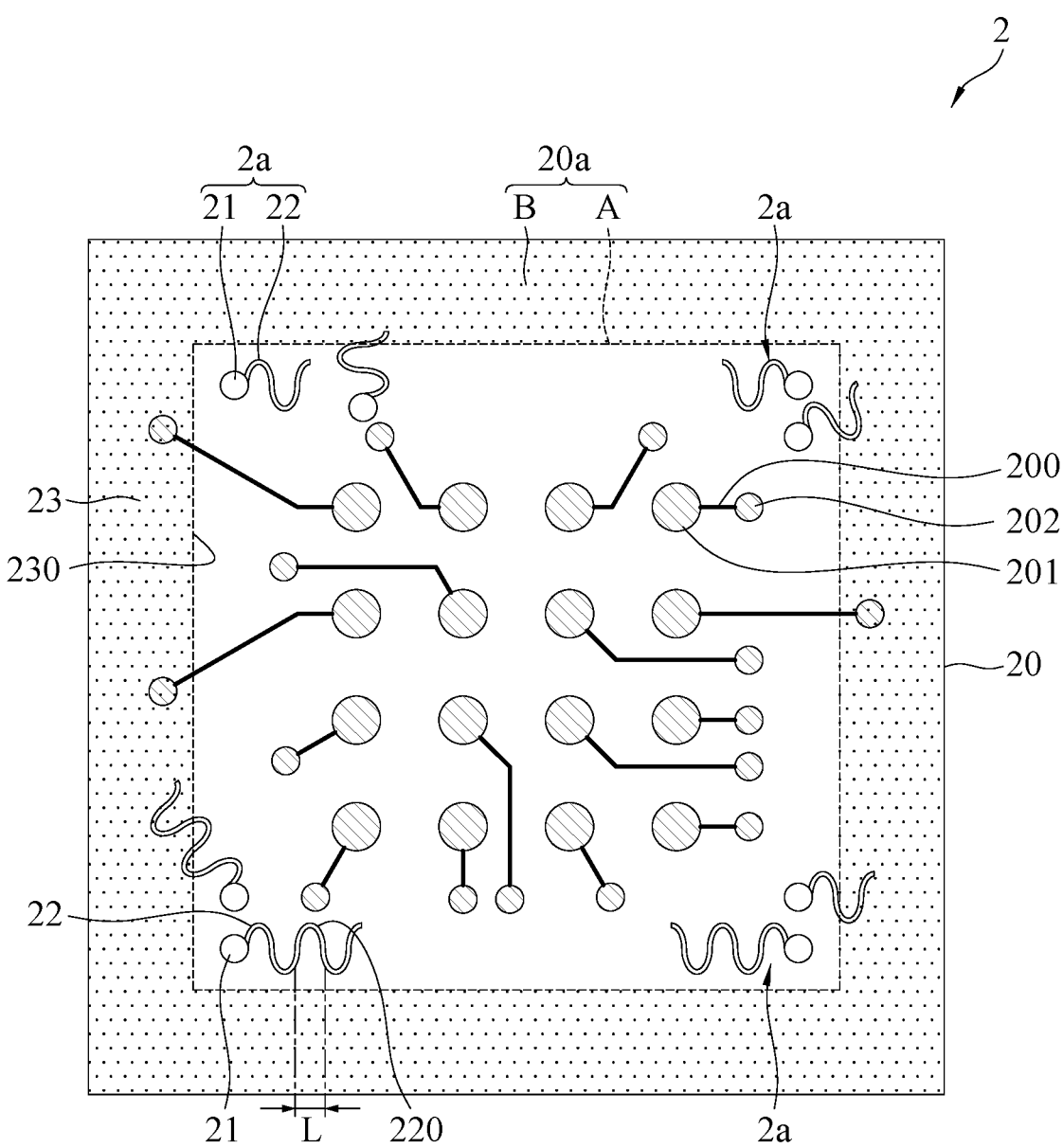
FIG. 2B is a schematic top view showing another aspect of FIG. 2A.

In addition, if an insulating protective layer 23 is formed on the outermost surface 20a of the substrate body 20, such as the solder resist layer shown in FIG. 2B, and the insulating protective layer 23 has an opening 230 exposing the die placement area A, then the area of the reinforcing portion 2a (the dummy pad 21 and the trace line 22) arranged on the die placement area A of the outermost surface 20a of the substrate body 20 is greater than or equal to 3500 $\mu m^2$, that is, the area of the reinforcing portion 2a exposed to the opening 230 (excluding the area of the reinforcing portion 2a at the layout area B or at the insulating protective layer 23) is greater than or equal to 3500 $\mu m^2$, and if the single trace line 22 has two curved line segments 220, then the area of the reinforcing portion 2a arranged on the die placement area A of the outermost surface 20a of the substrate body 20 is easily to be greater than or equal to 3500 $\mu m^2$.

Hence, in the substrate structure 2 of the present disclosure, the contact area between the reinforcing portion 2a and the insulating layer of the substrate body 20 is increased by the design of the trace line 22 connected to the dummy pad 21. Therefore, compared with the prior art, the substrate structure 2 of the present disclosure can improve the adhesion of the reinforcing portion 2a and the substrate body 20 to prevent the dummy pad 21 from falling off.

In addition, through the design of the trace line 22, the metal area on the insulating layer of the substrate body 20 is increased, so that the stress of the electronic element 40 can be dispersed. Therefore, compared with the prior art, the substrate structure 2 of the present disclosure can prevent the electronic element 40 from cracking after carrying the electronic element 40.

To sum up, in the electronic package and substrate structure thereof of the present disclosure, the layout area of the reinforcing portion is increased via the design of the trace line, which not only can improve the adhesion of the reinforcing portion, but also can prevent the electronic element from cracking. Therefore, the electronic package and substrate structure thereof of the present disclosure can effectively improve production yield.

The above embodiments are set forth to illustrate the principles of the present disclosure and the effects thereof, and should not be interpreted as to limit the present disclosure. The above embodiments can be modified by one of ordinary skill in the art without departing from the scope of the present disclosure as defined in the appended claims. Therefore, the scope of protection of the right of the present disclosure should be listed as the following appended claims.

What is claimed is:

1. A substrate structure, comprising:

a substrate body provided with a plurality of circuits on a surface thereof; and a reinforcing portion disposed on the surface of the substrate body and free from being electrically connected to the plurality of circuits, wherein the reinforcing portion comprises at least one dummy pad directly formed on the surface of the substrate body and at least one trace line connected to the at least one dummy pad, and the at least one dummy pad and the at least one trace line are in direct contact with the surface of the substrate body simultaneously.

2. The substrate structure of claim 1, wherein the surface of the substrate body is defined with a die placement area and a layout area surrounding the die placement area.

3. The substrate structure of claim 2, wherein the at least one dummy pad is disposed at a corner of the die placement area.

4. The substrate structure of claim 2, wherein an area of the reinforcing portion arranged on the die placement area of the surface of the substrate body is greater than or equal to 3500 μm².

5. The substrate structure of claim 1, wherein the reinforcing portion is made of metal.

6. The substrate structure of claim 1, wherein the at least one trace line is of a straight line shape.

7. The substrate structure of claim 1, wherein the at least one trace line has at least one curved line segment.

8. The substrate structure of claim 7, wherein the at least one curved line segment is of an arc shape, a wavy shape, or a straight-angle bend shape.

9. The substrate structure of claim 7, wherein a straight line distance between opposite ends of the at least one curved line segment is 15 μm.

10. The substrate structure of claim 1, wherein an area of the reinforcing portion arranged on the surface of the substrate body is greater than or equal to 3500 μm².

11. An electronic package, comprising:

the substrate structure of claim 1; and an electronic element disposed on the surface of the substrate body and electrically connected to the plurality of circuits, wherein the electronic element is free from being electrically connected to the reinforcing portion.

12. The electronic package of claim 11, wherein the surface of the substrate body is defined with a die placement area and a layout area surrounding the die placement area, such that the electronic element is disposed on the die placement area.

13. The electronic package of claim 12, wherein the at least one dummy pad is disposed at a corner of the die placement area.

14. The electronic package of claim 12, wherein an area of the reinforcing portion arranged on the die placement area of the surface of the substrate body is greater than or equal to 3500 μm².

15. The electronic package of claim 11, wherein the reinforcing portion is made of metal.

16. The electronic package of claim 11, wherein the at least one trace line is of a straight line shape.

17. The electronic package of claim 11, wherein the at least one trace line has at least one curved line segment.

18. The electronic package of claim 17, wherein the at least one curved line segment is of an arc shape, a wavy shape, or a straight-angle bend shape.

19. The electronic package of claim 17, wherein a straight line distance between opposite ends of the at least one curved line segment is 15 μm.

20. The electronic package of claim 11, wherein an area of the reinforcing portion arranged on the surface of the substrate body is greater than or equal to 3500 μm².

* * * * *